(12) United States Patent
Gierak et al.

(10) Patent No.: US 6,864,495 B2
(45) Date of Patent: Mar. 8, 2005

(54) DEVICE FOR GENERATING AN ION BEAM

(75) Inventors: Jacques Gierak, Le Plessis Pate (FR); Yvon Lagadec, Antony (FR); Albert Septier, Bourg la Reine (FR)

(73) Assignee: Centre National de la Recherche Scientifique, Paris (FR)

( * ) Notice: Subject to any disclaimer, the term of this patent is extended or adjusted under 35 U.S.C. 154(b) by 0 days.

(21) Appl. No.: 10/472,090

(22) PCT Filed: Mar. 26, 2002

(86) PCT No.: PCT/FR02/01041

§ 371 (c)(1),
(2), (4) Date: Sep. 17, 2003

(87) PCT Pub. No.: WO02/078036

PCT Pub. Date: Oct. 3, 2002

(65) Prior Publication Data

US 2004/0094725 A1 May 20, 2004

(30) Foreign Application Priority Data

Mar. 28, 2001 (FR) .......................................... 01 04173

(51) Int. Cl.⁷ ............................................... H01J 37/20
(52) U.S. Cl. ............................. 250/492.21; 250/396 R; 315/111.21
(58) Field of Search ........................ 250/492.21, 396 R, 250/492.2, 309; 315/111.21, 111.81

(56) References Cited

U.S. PATENT DOCUMENTS

| | | | |
|---|---|---|---|
| 4,426,582 A | | 1/1984 | Orloff et al. |
| 4,697,086 A | * | 9/1987 | Ishitani et al. ........... 250/492.2 |
| 4,704,526 A | | 11/1987 | Kyogoku et al. |
| 5,149,976 A | * | 9/1992 | Sipma ..................... 250/492.2 |
| 5,936,251 A | | 8/1999 | Gierak et al. |
| 6,337,540 B1 | * | 1/2002 | Corbin et al. ........... 315/111.21 |
| 6,649,919 B2 | * | 11/2003 | Chao et al. .............. 250/492.2 |

FOREIGN PATENT DOCUMENTS

| EP | 0 706 199 | 4/1996 |
|---|---|---|
| EP | 0 774 769 | 5/1997 |

OTHER PUBLICATIONS

U.S. Appl. No. 10/472,090, filed Sep. 17, 2003, Gierak et al.
U.S. Appl. No. 10/494,031, filed May 7, 2004, Gierak et al.
J Gierak et al.: "Design and realization of a very high–resolution FIB nanofabrication instrument" Nuclear Instruments & Methods in Physics Research, Section—A: Accelerators, Spectrometers, Detectors, and Associated Equipment, vol. 427, No. 1–2, pp. 91–98, May 11, 1999.

* cited by examiner

Primary Examiner—John R. Lee
Assistant Examiner—Zia R. Hashmi
(74) Attorney, Agent, or Firm—Oblon, Spivak, McClelland, Maier & Neustadt, P.C.

(57) ABSTRACT

An ion beam generation device including an ion source, an extraction mechanism for ions emitted by the source, an accelerating mechanism of the ions thus extracted, a selector for the ions thus accelerated, and an electrostatic optical system for focusing the selected ions along a first axis. Further, a mechanism varies the distance between the ion source and the extraction means, this distance being counted along a second axis parallel to the first axis and constituting the axis of the ion beam emitted by the source. The device may be particularly applied to the manufacture of nanostructures.

19 Claims, 2 Drawing Sheets

DEVICE FOR GENERATING AN ION BEAM

TECHNICAL FIELD

The present invention relates to an ion beam generation device and also a method of control of this beam.

This invention is particularly applied to the manufacture of structures having very small sizes, less than 50 nm, and more particularly to the manufacture of nanostructures having sizes of the order of 10 nm or less.

The invention finds application in various fields such as electronics (particularly relating to solely electron devices, for example transistors), data storage at ultra-high density (using nanostructures formed on magnetic materials), and ultra-high speed semiconductor devices (using nanostructures formed on semiconductor materials).

We indicate from now on that the present invention preferably uses a point ion source, that is, an ion source with a very bright, point emissive zone.

Moreover, this point ion source is preferably an LMIS, that is, a liquid metal ion source.

PRIOR ART

A liquid metal ion source is known from the following document, which is incorporated herein by reference: [1] International application PCT/FR 95/00903, international publication number WO 96/02065, invention of Jacques Gierak and Gérard Ben Assayag, corresponding to U.S. Pat. No. 5,936,251.

The source described in this document [1] is an example of a source which can be used in the present invention.

An ion beam generation device, comprising a liquid metal ion source as well as an asymmetric three-element electrostatic lens system, is known from the following document: [2] U.S. Pat. No. 4,426,582, invention of J. H. Orloff and L. W. Swanson.

The device known from document [2] has a disadvantage: it does not permit separation of the ion extraction function and the ion acceleration function.

Moreover ion beam generation devices are known in which are aligned an ion source, a diaphragm, and electrostatic lenses for focusing by means of appropriate displacements of the ion source and the diaphragm.

These known devices, termed FIB and producing focused ion beams, do not permit the manufacture of nanostructures of good quality and of sizes less than 50 nm.

Moreover, a device for controlling the shape of a focused ion beam is known from the following document: [3] U.S. Pat. No. 4,704,526, invention of H. Kyogoku and T. Kaito (Seiko Instruments and Electronics Ltd.).

The control method known from this document [3] is only a transposition of the control method conventionally used in scanning electron microscopy or in electron beam lithography.

Such a technique cannot be used in the nanometer field.

Moreover, this known method necessitates the prior formation of expensive and fragile calibration markers which cannot be reused.

SUMMARY OF THE INVENTION

The present invention has the object of remedying the previous disadvantages.

In contrast to the device known from document [2], the device of the invention permits separating the ion extraction function from the ion acceleration function.

Moreover, the invention uses a technique of aligning a diaphragm and electrostatic lenses along a mechanically perfect axis, a technique which leads to much better performance than that of the known FIB devices mentioned above: the present invention permits the manufacture of good quality nanostructures of sizes less than 50 nm.

Furthermore, the ion beam control method which is the subject of the invention is much more precise than the technique known from the document [3], and does not necessitate the prior production of expensive and fragile calibration markers.

The method of the invention may advantageously be used in any system of nano-manufacture by FIB and is in particular applied to the control of ion beam generated by the device of the invention.

More precisely, the present invention has as its object an ion beam generation device characterized in that it comprises an ion source, an extraction means for ions emitted by the source, an acceleration means for the thus extracted ions, a selection means for the ions thus accelerated, and an electrostatic optical system intended to focus the thus selected ions along a first axis, and in that the device furthermore comprises a means for varying the distance between the ion source and the ion extraction means, this distance being taken along a second axis which is parallel to the first axis and constitutes the axis of the ion beam emitted by the source.

According to a preferred embodiment of the device of the invention, the ion source is a point ion source.

Preferably, this point ion source is a liquid metal ion source.

According to a preferred embodiment of the invention, the ion extraction means and the ion acceleration means are mutually independent and are separately controlled by the application of respective variable voltages.

Preferably, the ion selection means comprises a means of selecting one diaphragm among a plurality of diaphragms and of placing the selected diaphragm on the first axis.

The device of the invention furthermore comprises, preferably, a means for displacement of the source parallel to the ion selection means, this displacement means being provided for bringing the first and second axes into coincidence.

The present invention likewise has as its object a control method for an ion beam emitted by an ion beam generation device toward a target and capable of eroding this target, this method being characterized in that it comprises a step of etching a test pattern on the target according to a predetermined digitized reference pattern, a step of forming a digitized image of the etched test pattern, and a step of differentiating between this digitized image of the etched test pattern and the digitized image of the predetermined reference pattern, and in that these steps are repeated after modifying at least one control parameter of the device, until suitable control is obtained.

According to a first particular embodiment of the method of the invention, the image of the test pattern is formed by means of the device, by then causing the latter to operate in a scanning ion microscope mode, and collecting the secondary electrons generated by sweeping the target with the ion beam, and the obtained image is digitized, and the steps are repeated after modifying at least one control parameter of the device, until the digitized image of the test pattern coincides with the digitized image of the reference pattern.

In this case, the control parameter(s) may be focusing parameters or astigmatism correction parameters.

According to a second particular embodiment of the method of the invention, the test pattern is a set of lines of predetermined length, formed by keeping the ion beam in a fixed position and displacing the target, and the image of the test pattern is formed by scanning ion microscopy and then digitized, and the parameters are gain parameters, in order to calibrate the size of the writing field.

BRIEF DESCRIPTION OF THE DRAWINGS

The present invention will be better understood on reading the description of embodiments given hereinafter, purely as illustrations and in no way limitative, and with reference to the accompanying drawings, in which.

DETAILED DESCRIPTION OF PARTICULAR EMBODIMENTS

Figure 1:
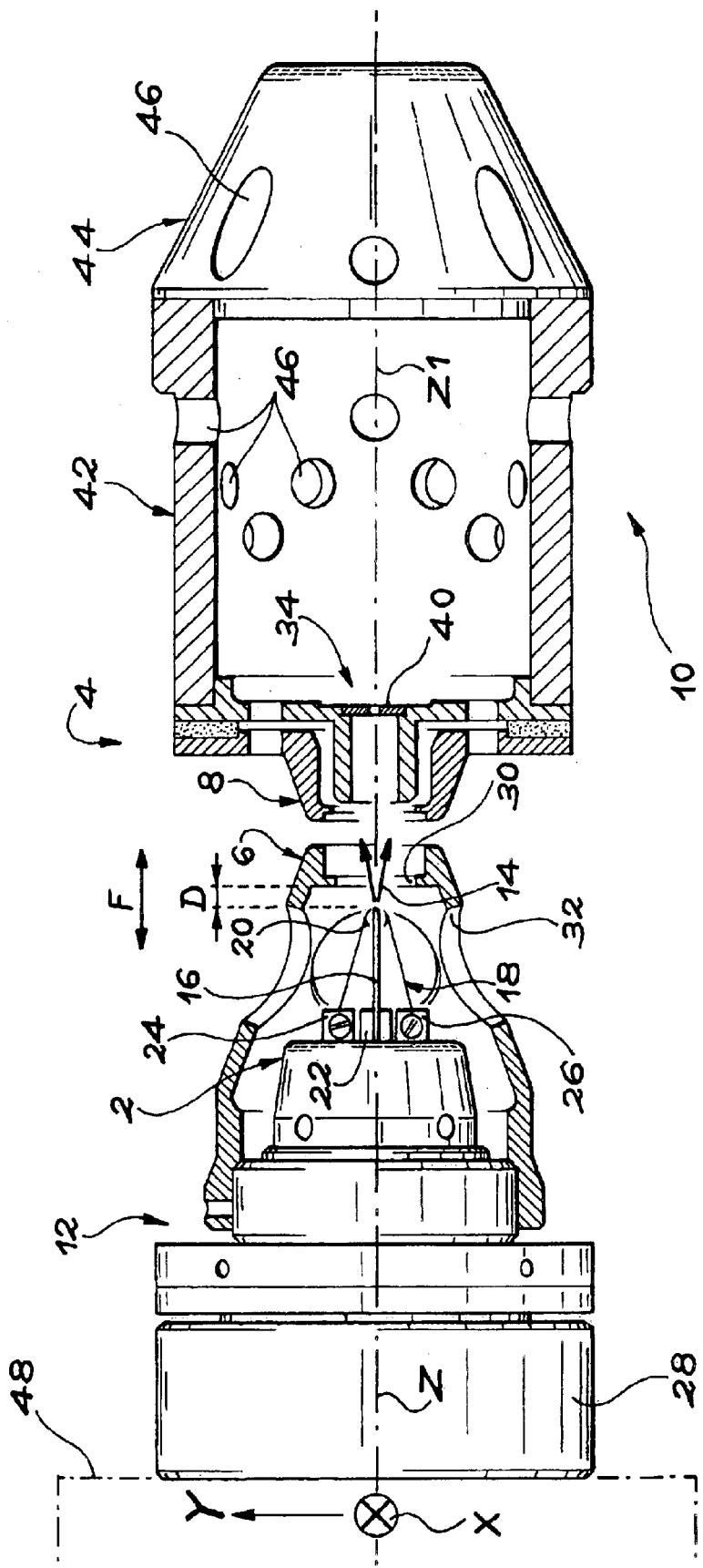
FIG. 1 is a schematic sectional view of a particular embodiment of the device of the invention.

FIG. 1 is a schematic view of a particular embodiment of the ion beam generation device of the invention.

The device of FIG. 1 comprises an ion source 2 for producing the ion beam, as well as an extraction and acceleration system 4 for the ion beam produced, this system comprising an extraction electrode 6 for the beam produced and an electrode 8 for the final acceleration of the beam extracted. This electrode 8 constitutes the input of the electrostatic optical system 10 which the device of FIG. 1 likewise comprises.

The support 12 of the ion source 2 may likewise be seen in this figure.

This source 2 is a conventional liquid metal ion source, for example for forming a gallium ion beam 14.

However, in the present invention, another LMIS could be used, for example of the kind described in document [1], to form an aluminum ion beam, for example.

Returning to FIG. 1, the conventional ion source 2 comprises a conductive rod 16 ending at a point, and also a conductive filament 18 having coils 20 through which the point passes. In a known manner, the rod is held by a pair of jaws 22. Conductive elements 24 and 26 for holding the ends of the filament may also be seen. A base 28 on which the support 12 for the source 2 is mounted may also be seen.

The extraction electrode 6 is provided with an extraction diaphragm 30 and with holes such as the hole 32, permitting residual gas to be pumped out when the device is to operate in vacuum.

The extraction and acceleration system 4 used in the device of FIG. 1 is original because of its geometry. The extraction electrode 6 for the beam 14 does not intercept the beam 14 at any point. The characteristic extraction voltage V0 for ion emission is controlled in the example considered by mechanically modifying the distance D between the source 2 and the extraction electrode 6, this distance being taken parallel to the axis Z of the ion beam 14 emitted by the source 2.

To do this, means are used for displacement of the extraction electrode 6 with respect to the source 2 (or of the source with respect to this electrode). This displacement means is symbolized by the arrow F in FIG. 1. It may be produced by those skilled in the art (and consists, for example, of a mechanical means based on a threaded rod).

Furthermore, the extraction electrode 6 and the final acceleration electrode 8 are independent and may be separately controlled by application of variable voltages.

The extraction and acceleration system 4 is likewise original by virtue of its optical characteristics. In operation, a voltage V1 is applied to the source 2 and a voltage V2 to the extraction electrode 6. When the difference V1–V2, equal to V0, is of the order of 10 kV, a beam of $Ga^+$ ions is emitted having an angular density of the order of 20 µA per unit solid angle (at the level of the axis Z of the beam, forming a central axis of revolution).

If V0 is increased to about 17 kV, the angular density measured under the same conditions reaches about 80 µA/steradian.

The system thus permits considerably increasing the useful brightness of an LMIS, and this constitutes one of the crucial points for the application of the FIB technique to nano-fabrication.

The extraction and acceleration system is likewise original because of its operating characteristics which make possible improved use of the operation of the source 2.

Each electrode 6 and 8 may be controlled in an independent and specific manner by a suitable high voltage generator (for example of the order of 20 kV to 40 kV) (not shown).

Ion emission is controlled by a first high voltage supply (not shown) which is specifically optimized for regulating the ion beam current emitted by the source 2. The value of this current is servo-controlled by feedback by means of an analog device optimized to have a rapid response dynamic. This servo-control is obtained by modifying the value of the voltage applied to the source 2 around a value permitting ion emission by field evaporation to be maintained (of the order of $10^9$ V/m).

It may be added that the emitted current may be known by means of a microammeter which is placed in the electrical supply permitting the point of the source to be polarized. As an alternative, to know this current, it is possible to measure the current drawn by the acceleration electrode 8.

The final ion energy is obtained by bringing the final acceleration electrode 8 to a voltage V2 positive with respect to ground. This potential V2 is controlled with very high stability. This stability is ensured by a generator (not shown) whose stability level is of the order of $10^{-6}$. For example, a chopping type supply is used, having such a stability level.

The extraction and acceleration system 4 of the ion beam 14 operates with a performance better than that of the conventional extraction and acceleration systems.

The device of FIG. 1 also comprises a system 34 (FIG. 2) for selecting the optical aperture of the focused ion column of the device, this column comprising the source 2, the source support 12, and the electrostatic optical system 10.

The optical aperture selection system 34 comprises an assembly including a bushing 36 provided for receiving a strip 38, controlled mechanically or electromechanically as symbolized by the arrow F1, this strip 38 carrying a plurality of calibrated diaphragms 40.

This strip 38 permits placing a calibrated diaphragm 40, chosen from among the calibrated diaphragms carried by the strip 38, on the central axis Z1 of the electrostatic optical system 10, by means of a translation along an X-axis perpendicular to this axis Z1. These diaphragms define different aperture values for the electrostatic optical system 10 of the focused ion column.

Figure 2:
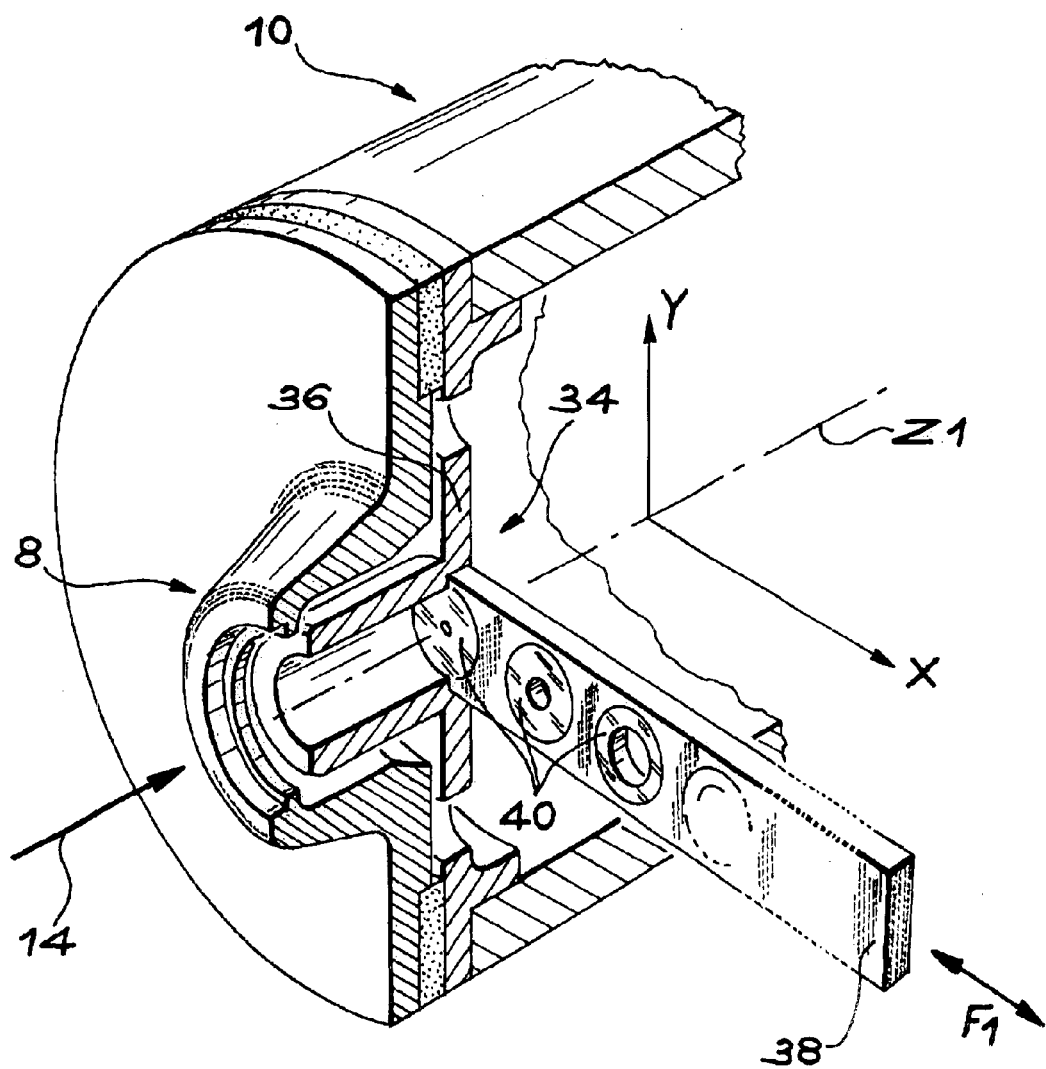
FIG. 2 is a partial schematic perspective view of the device of FIG. 1, showing the strip forming a diaphragm support used in the device of FIG. 1.

Likewise on FIGS. 1 and 2 there is defined a Y-axis perpendicular to the X-axis and also to the Z-axis, which is parallel to the Z1-axis.

The system for optical aperture selection 34 is original by reason of its general purpose.

Differing from all the known systems for optical aperture selection, this system used in the device of FIG. 1 does not have the purpose of permitting an alignment between a source, a diaphragm, and electrostatic lenses where the movable means to be "centered" along the X-axis and the Y-axis are the diaphragm as well as the ion source. Such a known system in fact only permits disposing plural easily interchangeable diaphragms having different sizes or the same size.

In the case of the device of FIG. 1, the centering of the essential elements of the electrostatic optical system 10, namely the assembly formed by the diaphragm 40 and by the electrostatic lenses 42 and 44, which will be returned to hereinafter, is ensured by close machining tolerances. Thus, the input diaphragm of the electrostatic and the associated lenses 42 and 44 are precisely aligned along one and only one optical axis Z1.

The principal purpose of this is to limit the optical aberrations induced by de-centering defects. These defects constitute the experimental limit of all known electrostatic optical systems.

Returning to the electrostatic lenses 42 and 44 used in the device of FIG. 1, it is stated that they are two in number, the first 42 being seen in very schematic section in the plane of FIG. 1, while the second 44 is seen from outside. Various holes 46 are also seen with which the lenses are provided and which in particular permit evacuating the electrostatic optical system 10.

So as to be able to replace the diaphragm 40 (FIG. 1) and to position the replacement diaphragm along the X-axis with an uncertainty less than a tenth of a micrometer, a prior calibration is necessary of the absolute position, along X, of the center of each diaphragm. A bench check on an optical check bench permits knowing precisely the positions of the different diaphragms.

The only really necessary adjustment in the case of the device of FIG. 1 consists of a displacement of the support 12, bearing the source 2, parallel to the input plane of the electrostatic optical system 10 and thus parallel to the diaphragm 40 (FIG. 1), this plane being parallel to the X and Y axes. This permits aligning the central axis Z of the emission core of the ion beam 14 with the optical axis Z1 of the electrostatic optical system 10.

To do this the base 28, which carries the source support 12, is provided with micrometer plates symbolized by dot-dash lines 48, permitting displacing this base and thus the support 12 along the X- and Y-axes.

With respect to the known systems, the optical aperture selection system of the device of FIG. 1 fulfills the following functions:

defining with the best possible precision a one and only optical axis passing through the center of the input diaphragm of the electrostatic optical system and the center of the various electrodes (not shown) defining the two electro-optical lenses, and permitting a very rapid change of the optical aperture of the focused ion column.

It should be noted that disposing several diaphragms permits the possibility of greater control of the electrostatic optical system and furthermore to space apart the interventions for maintaining the device.

Methods conforming to the invention will now be considered, particularly methods of focusing and adjustment of the size of a writing field on nano-manufacture focused by ion beam. These methods are important with regard to an effective automation of nano-manufacture by FIB.

The methods explained hereinafter aim at resolving the fundamental problem of controlling the parameters of an ion column providing an ion probe (focused ion beam directed onto a target) on a tens of nanometers scale.

This ion probe is intended to form nanometer-size structures by controlled ion irradiation.

The geometric form (size), the aspect (more or less rapid decrease of the number of particles on departing from the central axis of the beam) as well as the spherical characteristic of the distribution in the ion probe at the level of the target are preponderant. At a nanometer scale, the problems are all the more complicated.

The methods proposed here aim at permitting a rapid and very precise adjustment of the profile of this ion probe in a manual mode (requiring intervention by users), automatic mode (not requiring any intervention) or semi-automatic mode.

The points concerned are:

focusing (concentration) of the ion beam by the action of electrostatic lenses (which the beam generation device comprises), at the level of a target or of a sample, in an impact of nanometer dimensions, the correction of defects of sphericity of the incident ion probe, and the calibration of the writing field (field addressable by the beam under the action of electrostatic deflectors) at the surface of the target so as to always know the relative position thereof to about several nanometers.

It is added that the beam generation device comprises electrostatic deflectors for deviating this beam, and that the particular electrostatic optical system 14 of FIG. 1 contains scanning electrodes (not shown) which form the electrostatic deflectors.

Let us consider the problems to be solved.

The use of a focused ion beam in an impact of 10 nm for nano-manufacture applications has specific constraints which are very different from those occurring, for example, in scanning electron microscopy:

The pulverizing effect due to the energetic ions bombarding the target leads to a more or less long-term destruction of the calibration structures (generally gold markers on silicon) which are conventionally used, for example, in electron beam lithography. Moreover, the calibrated structures of several tens of nanometers are delicate to manufacture, very fragile, and above all very expensive.

The period of use of the ion beam can reach several hours, requiring periodic control of the characteristics of this ion beam to limit the influence of drift and of transitory instabilities.

The reduced working distances, which are necessary to obtain a geometrical enlargement of the source impact less than unity, further reduce the usable depth of field. Moreover, certain samples compromise patterns of very different heights, so that the patterns are not all situated at the ideal focal distance.

In this last case, an ion which falls on such a sample at the level of the optical axis traverses a much shorter path than another ion, deviated by several millimeters with respect to this axis. This optical path difference causes the appearance of defects or aberrations. To limit these aberrations to an acceptable value, the size of writing is limited to a field of the order of a hundred micrometers.

Thus, without an attached device, the technique of nano-manufacture by FIB can only form small, elementary patterns.

When an ultra-precise displacement of the sample is used, the possibility appears of connecting several sub-structures to define a pattern of larger size. But this remains subordinated to a rigorous calibration of the elementary writing field by FIB. In fact, the most perfect correspondence possible between the coordinates of points defined within a scan field and the coordinates of displacement of the plate which carries the sample is necessary.

All this is complex, because the scan of the ion probe is obtained by means of a CAO (computer assisted design) generator of the digital/analog type, while the plate carrying the sample is piloted by a specific and independent interface. It should also be noted that any variation of the distance between the sample and the ion column, of the energy of the ions, or of the nature of the latter, modifies the value of the amplitude of the scan field.

In the present invention, a method is proposed which is rapid, and is capable of being automated to calibrate the optical system of an ion column, by using the property of heavy ions such as ions of gallium or of other metals, for example aluminum, of locally etching the target which they strike.

With this method, the same ion beam generation device is capable of forming its own calibration marks, then verifying them, in a completely self-contained manner.

It is proposed first of all to use the erosive effect of the incident ion beam produced by an ion beam generation device to etch a simple structure according to a pattern predetermined by CAO, for example of a square, simple hole ("spot"), or cross type, in a "sacrificed" zone of the sample. After FIB etching, this structure is then imaged by the same device, now operated in MIB, or scanning ion microscopy, mode under the same conditions without any modification, by simply collecting the secondary electrons resulting from scanning the surface of the sample with the ion beam. The MIB image obtained is digitized and, on this digitized MIB image, corresponding to the effectively etched structure, it is then possible to informatically superpose the digitized initial predetermined pattern (square, hole or cross, for example) and to differentiate (digitally) the two images. In the case of a square type pattern, for example, a defect due to poor focusing can then be detected and then remedied by increasing step by step the localizing effect of the lenses with which the beam generation device is provided. The process may be automated for different enlargements and may be repeated step by step, until the digitized MIB image and the initial pattern coincide perfectly.

The same erosive effect may also be made use of for correcting a possible defect of sphericity, also termed an astigmatic defect, at the level of the impact of incident ions. In this case, piercing a single hole of the order of 10 to 20 nm permits obtaining very rapidly, in several tenths of a second, a faithful image of the imprint. If an elliptical aspect of the impact is sound, always by comparison with an "ideal" reference image (circular image), and according to the orientation of the obtained ellipse, it is possible to begin a procedure of correction and iterative tests until the satisfactory decision criterion, established by the users, makes the informatic system used leave this sequence (preferably automatically).

The calibration of the size of FIB writing field is the last crucial point which it is possible to make use of, preferably in an automated manner, with a method according to the invention. This method consists firstly of etching lines (set of parallel lines or set of crossed lines) having a length known with very little uncertainty. To do this, the ion beam is kept in the "spot" mode and does not scan the surface of the sample, while the latter is displaced by means of the plate which supports the sample, the measurement of the displacements of this plate being performed by laser interferometry. In this case, the mechanical precision may be as good as several nanometers (of the order of 10 nm to 5 nm).

In this case, the markers are not found by scanning the target surface with the ion probe, but solely by displacing this target, the central axis of the etching ion beam being kept fixed. An MIB image of the structures thus manufactured then permits, after digitization of this image, adjusting the gain of the amplifier stage of the ion beam generation device so that a digital weight of one or more bits corresponds to a known displacement (of a certain number of nanometers) at the level of the sample. The calibration of the scan field is then effected with the technique of laser interferometry measurement, the most efficient technique at present known for measuring relative displacements, and furthermore, a technique used by the National Bureau of Measurements.

What is claimed is:

1. Ion beam generation device, comprising:

an ion source configured to emit ions;

ion extraction means for extracting ions emitted by the ion source;

ion acceleration means for accelerating ions thus extracted;

ion selection means for selecting the accelerated ions thus accelerated;

an electrostatic optical system configured to focus the ions thus selected along a first axis; and distance varying means for varying a distance between the ion source and the ion extraction means to control an extraction voltage for ion emission of the device, the distance being taken along a second axis parallel to the first axis and that constitutes an axis of the ion beam emitted by the ion source.

2. Device according to claim 1, wherein the ion source is a point ion source.

3. Device according to claim 2, wherein the point ion source is a liquid metal ion source.

4. Device according to claim 1, wherein the ion extraction means and the ion acceleration means are independent from one another and are further controlled separately of one another by application of respective variable voltages.

5. Device according to claim 1, wherein the ion selection means comprises means for selecting one diaphragm among a plurality of diaphragms and for placing the selected diaphragm on the first axis.

6. Device according to claim 1, further comprising displacement means for displacing the ion source in a direction parallel to the ion selection means, and configured to bring the first and second axes into coincidence.

7. Method of calibrating an ion beam generation device with a target configured to be eroded by the device, the method comprising:

(a) etching a test pattern on the target corresponding to a digitized predetermined reference pattern;

(b) forming a digitized image of the etched test pattern;

(c) comparing the digitized image of the etched test pattern and the digitized image of the predetermined reference pattern;

(d) modifying of at least one control parameter of the device, and (e) repeating steps (a) to (d), if necessary, until a suitable control of a geometry, size, or density of the ion beam is obtained.

8. Method according to claim 7, wherein the etched test pattern is imaged by operating the ion beam generation device in a scanning ion microscope mode and collecting secondary electrons produced by scanning the target with the ion beam, and steps (a) through (d) are repeated, if necessary, until the digitized image of the etched test pattern coincides with the digitized image of the predetermined reference pattern.

9. Method according to claim 8, wherein the at least one control parameter includes a focusing parameter.

10. Method according to claim 8, wherein the at least one control parameter includes an astigmatism correction parameter.

11. Method of calibrating an ion beam generation device with a target configured to be eroded by the device, the method comprising:

etching a test pattern on the target by moving the target in a direction for a known displacement;

forming a digitized image of the etched test pattern; and adjusting a gain of the device to correspond to a digital weight of one or more bits of the digitized image of the etched test pattern such that the gain corresponds to the known displacement or a fraction of the known displacement.

12. Ion beam generation device, comprising:

an ion source configured to emit ions;

an ion extraction unit configured to extract the ions emitted by the ion source;

an ion acceleration unit configured to accelerate the ions thus extracted;

an ion selection unit configured to select the ions thus accelerated;

an electrostatic optical system configured to focus the ions thus selected along a first axis; and a mechanism configured to mechanically modify a distance between the ion source and the ion extraction unit to control an extraction voltage for ion emission of the device, the distance being taken along a second axis parallel to the first axis and that constitutes an axis of the ion beam emitted by the ion source.

13. Device according to claim 12, wherein the ion source is a point ion source.

14. Device according to claim 13, wherein the point ion source is a liquid metal ion source.

15. Device according to claim 12, wherein the ion extraction unit and the ion acceleration unit are independent from one another and are further controlled separately of one another by application of respective variable voltages.

16. Device according to claim 12, wherein the ion selection unit comprises means for selecting one diaphragm among a plurality of diaphragms and for placing the selected diaphragm on the first axis.

17. Device according to claim 12, further comprising a displacement unit configured to displace the ion source in a direction parallel to a moving direction of the ion selection unit and configured to bring the first and second axes into coincidence.

18. Method according to claim 7, wherein the device is the device of claim 12.

19. Method according to claim 11, wherein the device is the device of claim 12.

* * * * *